(12) United States Patent
Lee et al.

(10) Patent No.: US 9,153,487 B2
(45) Date of Patent: Oct. 6, 2015

(54) METHODS OF FORMING WIRINGS IN ELECTRONIC DEVICES

(75) Inventors: Seung-ho Lee, Suwon-si (KR);
Young-ki Hong, Anyang-si (KR);
Sung-gyu Kang, Suwon-si (KR);
Joong-hyuk Kim, Seoul (KR); Jae-woo Chung, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 157 days.

(21) Appl. No.: 13/601,658

(22) Filed: Aug. 31, 2012

(65) Prior Publication Data

US 2013/0164932 A1    Jun. 27, 2013

(30) Foreign Application Priority Data

Dec. 23, 2011    (KR) .................. 10-2011-0141720

(51) Int. Cl.
| H01L 21/285 | (2006.01) |
| H01L 21/768 | (2006.01) |
| H01L 21/311 | (2006.01) |
| H01L 27/12 | (2006.01) |

(52) U.S. Cl.
CPC .... *H01L 21/76885* (2013.01); *H01L 21/31127* (2013.01); *H01L 21/76814* (2013.01); *H01L 21/76822* (2013.01); *H01L 21/76879* (2013.01); *H01L 27/124* (2013.01); *H01L 27/1292* (2013.01)

(58) Field of Classification Search
CPC ........... H01L 2924/15153; H01L 2924/15165; H01L 21/28562; H01L 21/76814; H01L 21/76822; H01L 21/76885; H01L 21/31127; H01L 27/124; H01L 27/1292

USPC ......... 438/622, 623–624, 637–640, 700, 702; 257/E21.577, E21.578

See application file for complete search history.

(56) References Cited

U.S. PATENT DOCUMENTS

| 6,100,950 | A | 8/2000 | Tanaka |
| 7,612,455 | B2 | 11/2009 | Tano et al. |
| 2008/0318408 | A1* | 12/2008 | Yamada et al. ............... 438/618 |
| 2011/0247865 | A1* | 10/2011 | Tsurumi ....................... 174/255 |

FOREIGN PATENT DOCUMENTS

| KR | 100264757 B1 | 9/2000 |
| KR | 20060006749 A | 1/2006 |
| KR | 100738168 B1 | 9/2006 |
| KR | 100725251 B1 | 6/2007 |
| KR | 20110063052 A | 6/2011 |
| WO | WO-2010058662 A1 | 5/2010 |

* cited by examiner

*Primary Examiner* — Thanhha Pham
(74) *Attorney, Agent, or Firm* — Harness, Dickey & Pierce, PLC

(57) ABSTRACT

A method of forming a wiring may include forming a first wire on a substrate; forming a material layer on the substrate, except on the first wire; forming a surface treatment film on the material layer; and forming a second wire on the first wire. The surface treatment film has physical properties opposite to the first wire. A method of forming a wiring may include forming a first wire on a substrate; forming a material layer on the substrate and the first wire; removing a portion of the material layer from the first wire; forming a surface treatment film on the material layer and the first wire; removing a portion of the surface treatment film from the first wire; and forming a second wire on the first wire. A thickness of the material layer on the substrate is greater than a thickness of the first wire on the substrate.

29 Claims, 9 Drawing Sheets

METHODS OF FORMING WIRINGS IN ELECTRONIC DEVICES

CROSS-REFERENCE TO RELATED APPLICATION(S)

This application claims priority from Korean Patent Application No. 10-2011-0141720, filed on Dec. 23, 2011, in the Korean Intellectual Property Office (KIPO), the entire contents of which are incorporated herein by reference.

BACKGROUND

1. Field

Example embodiments may relate to methods of manufacturing electronic devices. Example embodiments also may relate to methods of forming wirings in electronic devices.

2. Description of Related Art

Recently, studies have been actively performed on high definition panels, and the development trend on panels for thin-film transistor-liquid crystal displays (TFT-LCDs) extends to a super high definition level, such as from an ultra-definition (UD) level to a super ultra-definition (SUD) level beyond a conventional full-high definition (Full-HD) level.

The larger the TFT-LCD becomes, the resistances of wirings increase. Thus, a resistance capacitance (RC) delay phenomenon occurs in the wirings. Also, as the definition of a panel increases, the number of pixels and TFTs are increased, and accordingly, the RC delay phenomenon may further be a big problem. Accordingly, attempts have been conducted to reduce the RC delay phenomenon by reducing the resistances of wirings.

SUMMARY

Example embodiments may provide methods of forming wirings that mitigate an RC delay phenomenon in electronic devices.

In some example embodiments, a method of forming a wiring may comprise forming a first wire on a region of a substrate; forming a material layer having a thickness greater than that of the first wire on the substrate, except on the first wire; forming a surface treatment film on an upper surface of the material layer; and/or forming a second wire on the first wire. The surface treatment film may have physical properties opposite to that of a surface of the first wire.

In some example embodiments, forming a first wire may be performed before or after forming a material layer on the substrate.

In some example embodiments, forming a surface treatment film may comprise coating a solution that includes a component of the surface treatment film on the first wire and the material layer; drying the coated solution; and/or removing the dried resultant product from the surface of the first wire.

In some example embodiments, forming a material layer and forming a surface treatment film on an upper surface of the material layer may comprise sequentially forming the material layer and the surface treatment film on the substrate; removing a portion of the surface treatment film corresponding to the first wire; and/or removing a portion of the material layer corresponding to the first wire.

In some example embodiments, forming a second wire on the first wire may comprise inkjet printing conductive ink that includes a component of the second wire on the first wire.

In some example embodiments, the method may further comprise removing contaminants from a surface where the surface treatment film is formed before forming the surface treatment film.

In some example embodiments, the material layer may be an organic material layer or an inorganic material layer.

In some example embodiments, the surface treatment film may be a hydrophobic film. The surface treatment film may be an organic material film that comprises a self-assembled monolayer or a fluorine group polymer compound.

In some example embodiments, the first wire may be at least one of a wiring that connects a semiconductor device and a power source, a wiring that connects a semiconductor device and another semiconductor device, a wiring that connects a semiconductor device and a connection wire, a wiring that connects a semiconductor device and a pixel, and a wiring that connects two separated contacts.

In some example embodiments, removing the dried resultant product from the surface of the first wire may comprise irradiating UV rays on a remaining film, after drying the coated solution, until the first wire is exposed.

In some example embodiments, removing a portion of the surface treatment film corresponding to the first wire may comprise irradiating UV rays on a portion of the surface treatment film corresponding to the first wire.

In some example embodiments, the first wire may be formed before the material layer is formed.

In some example embodiments, the first wire may be formed after removing a portion of the material layer corresponding to the first wire.

In some example embodiments, the method may further comprise removing contaminants from a surface where the surface treatment film is formed before forming the surface treatment film.

In some example embodiments, the self-assembled monolayer may be an organic silicon compound film.

In some example embodiments, the UV rays may be deep UV rays or UV-ozone rays.

In some example embodiments, removing contaminants may comprise irradiating UV rays or plasma onto the surface where the surface treatment film is formed.

In some example embodiments, the organic silicon compound film may include $RSiX_3$, where R is an n-alkylsilane compound and/or X is a halogen or an alkoxy group.

In some example embodiments, the plasma may be oxygen plasma and/or argon plasma.

In some example embodiments, a method of forming a wiring may comprise forming a first wire on a substrate; forming a material layer on the substrate and the first wire; removing a portion of the material layer from the first wire; forming a surface treatment film on the material layer and the first wire; removing a portion of the surface treatment film from the first wire; and/or forming a second wire on the first wire. A thickness of the material layer on the substrate may be greater than a thickness of the first wire on the substrate.

In some example embodiments, forming a second wire on the first wire may comprise inkjet printing conductive ink that includes a component of the second wire on the first wire.

In some example embodiments, the material layer may be an organic material layer.

In some example embodiments, the material layer may be an inorganic material layer.

In some example embodiments, a surface of the first wire may be hydrophilic.

In some example embodiments, a surface of the substrate may be hydrophilic.

In some example embodiments, a surface of the substrate may be hydrophobic.

In some example embodiments, a surface of the surface treatment film may be hydrophobic.

In some example embodiments, the method may further comprise removing contaminants from a surface of the material layer before forming the surface treatment film on the material layer.

In some example embodiments, the method may further comprise removing contaminants from a surface of the first wire before forming the surface treatment film on the first wire.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1A:
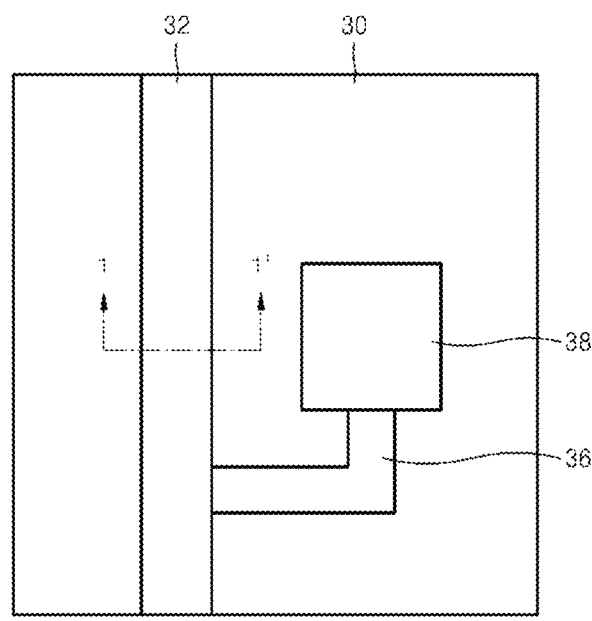
FIG. 1A is a plan view showing a connection between a semiconductor device and a first wire.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1B:
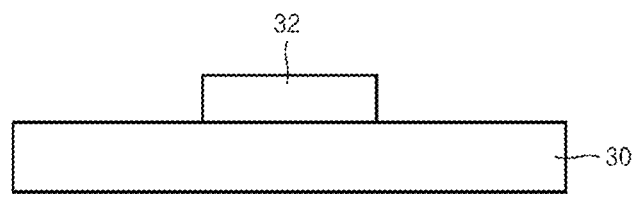
FIG. 1B is a cross-sectional view taken along a line 1-1' of the first wire of FIG. 1A.

FIG. 1A is a plan view showing a connection between a semiconductor device 38 and a first wire 32. FIG. 1B is a cross-sectional view taken along a line 1-1' of the first wire 32 of FIG. 1A.

Referring to FIG. 1A, the first wire 32 and the semiconductor device 38 are separately formed on a substrate 30. The first wire 32 and the semiconductor device 38 are connected via a connection wire 36. A plurality of semiconductor devices may further be connected to the first wire 32. The semiconductor device 38 may be, for example, a thin-film transistor (TFT) or a storage node. The first wire 32 may be, for example, a data line. The semiconductor device 38 may be connected to other components, for example, pixels (not shown). The first wire 32 may be at least one of a wiring that connects a semiconductor device to a power source, a wiring that connects a semiconductor device to another semiconductor device, a wiring that connects a semiconductor device to a specific wiring (for example, a data wiring), a wiring that connects a semiconductor device to a pixel, or a wiring that connects two separated contacts.

Referring to FIG. 1B, the first wire 32 formed on the substrate 30 has a desired (or alternatively, predetermined) thickness.

Hereinafter, a method of increasing the total thickness of a wiring by further forming another wiring on the first wire 32 is described. The first wire 32 may be formed by using a photolithography method. Also, the first wire 32 may be formed by selectively depositing a metal film using a shadow mask. The first wire 32 may be a wiring that connects the semiconductor device 38 to a power source or a wiring that connects the semiconductor device 38 to another part of an electronic product that includes the semiconductor device 38. For example, the first wire 32 may be a wiring that connects a TFT to a pixel in a display apparatus. Also, the first wire 32 may be a source line connected to a source, a drain line connected to a drain, or a gate line connected to a gate of a TFT. The substrate 30 may be, for example, a glass substrate or a plastic substrate, or a flexible substrate. The first wire 32 may be formed of a metal, for example, one selected from the group consisting of aluminum (Al), molybdenum (Mo), copper (Cu), and chromium (Cr).

Figure 2:
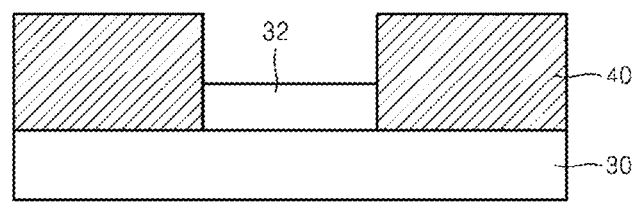
FIGS. 2 through 9 are cross-sectional views showing a method of forming a wire, according to some example embodiments.

FIGS. 2 through 9 are cross-sectional views showing a method of forming a wire, according to some example embodiments. Referring to FIG. 2, a material layer 40 that covers around the first wire 32 is formed on the substrate 30. The material layer 40 is formed to have a thickness greater than that of the first wire 32. Accordingly, after forming the material layer 40, a step difference is formed between the first wire 32 and the material layer 40. When the material layer 40 is formed, semiconductor devices formed on the substrate 30 may be covered by the material layer 40. The material layer 40 may be an organic material layer or an inorganic material layer. The organic material layer may be, for example, a photoresist layer. The inorganic material layer may be, for example, a silicon oxide group layer such as $SiO_2$.

Figure 3:
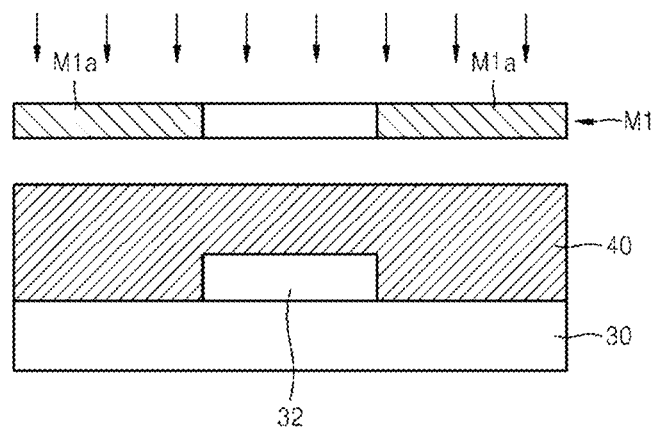
Figure 4:
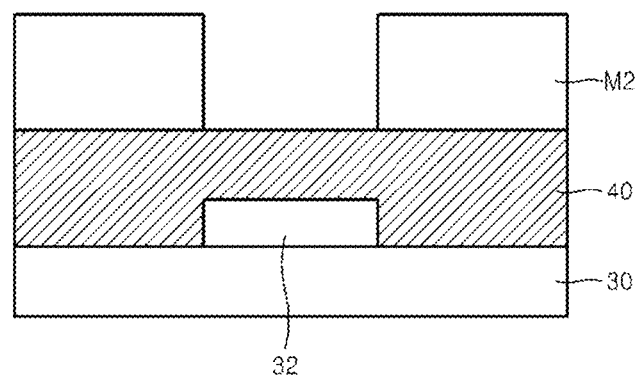

FIGS. 3 and 4 show a process of forming the material layer 40.

Referring to FIG. 3, the material layer 40 that covers the first wire 32 is formed on the substrate 30. The material layer 40 may be a positive photoresist layer. A photomask M1 is aligned above the material layer 40. The photomask M1 includes a light-shielding region M1a. The photomask M1 may be aligned so that the light-shielding region M1a is located above the material layer 40 and not the first wire 32. The material layer 40 is exposed through the photomask M1. As a result, a portion of the material layer 40 located on the first wire 32 is exposed. Afterwards, the photomask M1 is removed and the exposed resultant product is developed, the exposed portion of the material layer 40 on the first wire 32 is removed, and thus, the resultant structure of FIG. 2 is obtained.

If the material layer 40 is a hard material layer, for example, a $SiO_2$ layer, a mask M2 is formed on the material layer 40. At this point, the mask M2 on the material layer 40 may cover around the first wire 32, and may expose the portion of the material layer 40 above the first wire 32. After forming the mask M2, the material layer 40 around the mask M2 is etched. The etching is performed until the first wire 32 is exposed. After etching, the mask M2 is removed, and as a result, the resultant product of FIG. 2 is obtained.

Figure 5:
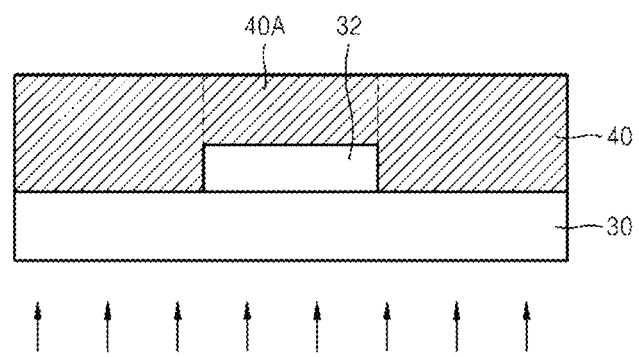

Alternatively, when the material layer 40 is a negative photoresist layer, as depicted in FIG. 5, back exposing may be performed. That is, the exposure may be performed through the substrate 30 from a lower side of the substrate 30. In this exposure, the first wire 32 functions as a light-shielding film. Accordingly, in the above back exposing, the material layer 40 formed around the first wire 32 is exposed. However, the portion 40A of the material layer 40 formed on the first wire 32 is not exposed in the back exposing. In a developing process after the exposing, the back exposed portion of the material layer 40 remains and the portion of the material layer 40 formed on the first wire 32 is removed, and thus, the resultant product of FIG. 2 is obtained. In the case of FIG. 5, an additional mask is unnecessary, and self-aligning is achieved due to the first wire 32.

Next, a process after obtaining the resultant product of FIG. 2 is described.

Figure 6:
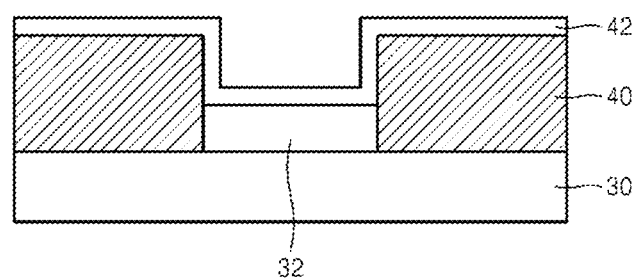

Referring to FIG. 6, after forming the material layer 40, a surface treatment film 42 having a hydrophobic property is formed on the material layer 40 and the first wire 32. The surface treatment film 42 may be a self-assembled monolayer (SAM) or an organic material layer. The SAM may include a self-assembling material. The self-assembling material may be regarded as a seed material. The self-assembling material may be, for example, an organic silicon compound. The organic silicon compound may be $RSiX_3$, where R may be an n-alkylsilane of an alkyl group, and X may be a halogen or an alkoxy group. Accordingly, the organic silicon compound may be, for example, n-alkyltrichlorosilane or n-alkyltrialkoxysilane. The organic material layer may include, for example, a fluorine group polymer compound.

A process of forming the surface treatment film 42 using the above materials is as follows. After forming a mixed solution by mixing the self-assembling material and a solvent or by mixing an organic material that includes a fluorine group polymer compound and a solvent, this solution is coated on the substrate 30 on which the first wire 32 and the material layer 40 are formed, and afterwards, the solvent is vaporized. At this point, the coating of the mixed solution may be performed by dip coating or spin coating. Before forming the surface treatment film 42, a process of removing contaminants from a surface of the substrate 30 may be performed. For example, contaminants on portions of the first wire 32 and the material layer 40, which are formed on the substrate 30 where the mixed solution is coated, may be removed. For example, contaminants may be removed from the surfaces of the first wire 32 and the material layer 40 on which the mixed solution is coated by exposing the surfaces of the first wire 32 and the material layer 40 to ultraviolet (UV) rays or plasma. At this point, the ultraviolet rays may be deep UV rays or UV-ozone. The plasma may be oxygen plasma or argon plasma.

Figure 7:
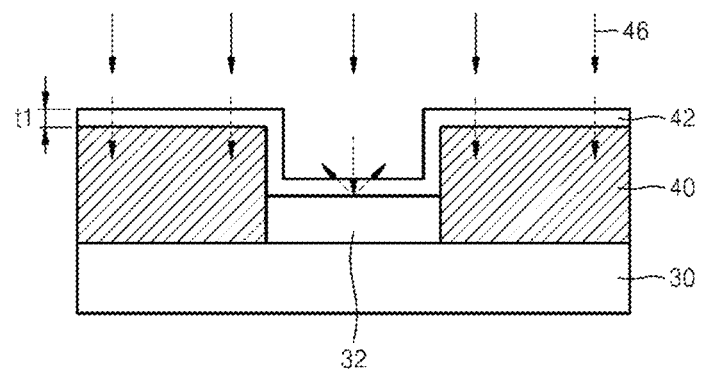
Figure 8:
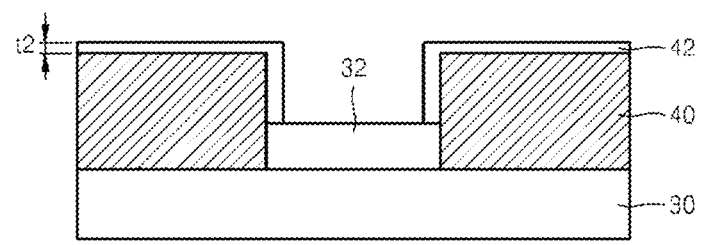

Referring to FIG. 7, UV rays 46 are irradiated onto the surface treatment film 42. The UV rays 46 may be, for example, deep UV or UV ozone. As the UV rays 46 are irradiated, the removal of the surface treatment film 42 begins. Accordingly, a thickness of the surface treatment film 42 before irradiating the UV rays 46 may be reduced after the UV rays 46 are irradiated for a desired (or alternatively, predetermined) period of time. The removal rates of the thickness of the surface treatment film 42 as a result of the irradiation of the UV rays 46 onto the first wire 32 and the material layer 40 may be different. That is, when the UV rays 46 are irradiated around the first wire 32, the UV rays 46 may reach to the substrate 30 through the surface treatment film 42 and the material layer 40. However, the UV rays 46 that are incident to the surface treatment film 42 formed on the first wire 32, as indicated by dashed lines, after passing through the surface treatment film 42, re-enter into the surface treatment film 42 after being reflected by or being scattered on the surface of the first wire 32, which is a metal layer. Accordingly, in the irradiation of the UV rays 46 with respect to the surface treatment film 42, the removal rate of the surface treatment film 42 on the first wire 32 is greater than that of the surface treatment film 42 formed on the material layer 40. Accordingly, as time passes after the irradiation begins, there is a time at which the removal of the surface treatment film 42 on the first wire 32 is faster than other areas. Thus, the surface treatment film 42 formed on the first wire 32 may be removed faster than other areas. As depicted in FIG. 8, the irradiation of the UV rays 46 may be performed until the surface of the first wire 32 is exposed. When the irradiation begins, the removal of the surface treatment film 42 starts. Therefore, after performing the irradiation of the UV rays 46 for a desired (or alternatively, predetermined) period of time, for example, after the surface of the first wire 32 is exposed, the thickness t2 of the surface treatment film 42 that remains on the material layer 40 may be thinner than the thickness t1 of the surface treatment film 42 before the UV rays 46 are irradiated.

Figure 9:
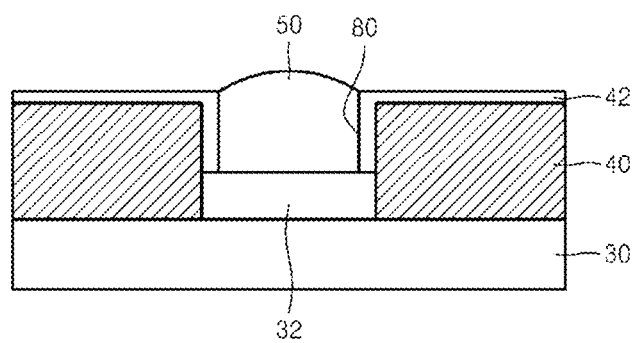

Referring to FIG. 9, a second wire 50 is formed in a trench 80 on the first wire 32. The trench 80 is filled with the second wire 50. The material layer 40 and/or surface treatment film 42 functions as a wall for forming the trench 80. The first and second wires 32 and 50 may become one wire. Because the second wire 50 is formed on the first wire 32, the thickness of the total wire is increased. Accordingly, a wire resistance of the total wire is decreased when compared to that of the first wire 32, and thus, the RC delay phenomenon may be mitigated. The second wire 50 may be formed of a conductive ink that includes a metal component, such as silver (Ag), molybdenum (Mo), or aluminum (Al) by using an inkjet printing method. After forming the second wire 50, a drying process with respect to the second wire 50 may be performed. After drying the second wire 50, if necessary, the material layer 40 and the surface treatment film 42 formed on the material layer 40 may be removed.

Due to the irradiation of the UV rays 46 as described above, the surface treatment film 42 having a hydrophobic property remains on the material layer 40, and the surface treatment film 42 does not remain on most part of an upper surface of the first wire 32. The surface of the first wire 32 has a hydrophilic property. Accordingly, after irradiating the UV rays 46, a second wire 50 is generated between the hydrophilic surface of the first wire 32 and the hydrophobic surface of the surface treatment film 42 that remains on the material layer 40. The surface energy difference may be one of the causes for collecting the conductive ink on the first wire 32 in the inkjet printing process. In the inkjet printing process, a step difference between the first wire 32 and the material layer 40 may provide an effect of collecting the conductive ink printed (dropped) on the first wire 32 in the trench 80. Accordingly, a width of the first wire 32 is narrower, the second wire 50 may be formed by sufficiently printing the conductive ink on the first wire 32. This denotes that a wire that includes the first and second wires 32 and 50 may be formed with a minute line width due to the surface energy difference and the step difference. Accordingly, in the method of forming a wire, according to some example embodiments, a pixel integration degree is high, and thus, may be applied to display devices that require a minute line width.

Figure 10:
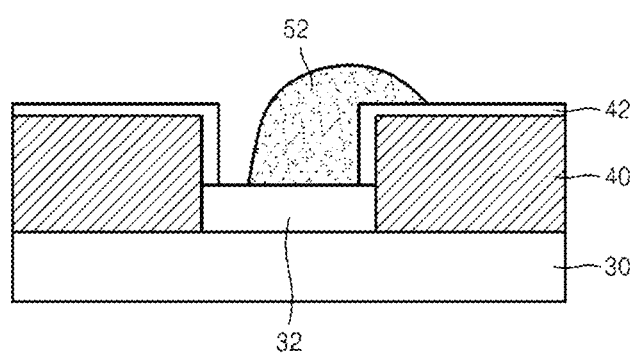
FIGS. 10 and 11 are cross-sectional views showing a portion of ink running outside of a first wire in an inkjet printing process.
Figure 11:
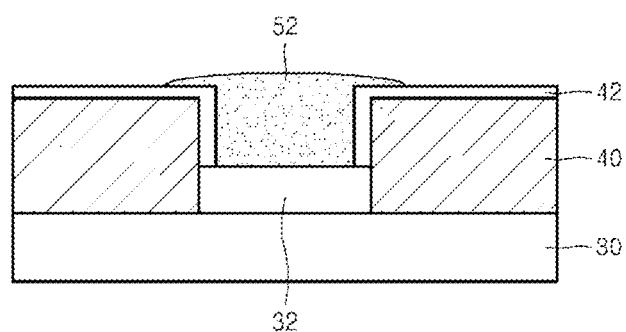

FIG. 10 shows a conductive ink 52 dropped in a portion of the trench 80 on the first wire 32 and on the surface treatment film 42 on the material layer 40. FIG. 11 shows the conductive ink 52 filled in the trench 80 and on portions of the surface treatment film 42 on both sides of the trench 80. In the cases of FIGS. 10 and 11, due to the surface energy difference and the step difference, the conductive ink 52 spreads in the trench 80 on the first wire 32, and as a result, as depicted in FIG. 9, the second wire 50 is formed on the first wire 32.

Figure 12:
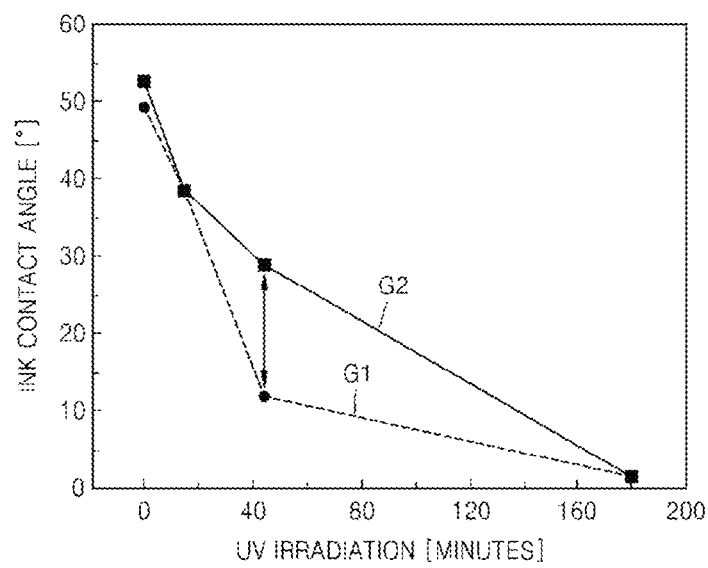
FIG. 12 is a graph showing variations of a contact angle of ink according to irradiation of ultraviolet rays in a method of forming a wire, according to some example embodiments.

FIG. 12 is a graph showing the test results of relationships between the irradiation times of the UV rays 46 versus contact angles of the conductive ink 52 used for the inkjet printing. In FIG. 12, a horizontal axis indicates UV ray irradiation time (minutes), and a vertical axis indicates ink contact angle (degrees). In FIG. 12, a first graph G1 shows the variations of ink contact angles of the conductive ink 52 dropped on the surface treatment film 42 that remained on the first wire 32. A second graph G2 shows contact angles of the conductive ink 52 dropped on the surface treatment film 42 that remained on the material layer 40.

In the experiments to obtain the results shown in FIG. 12, the substrate 30 was a glass substrate, the first wire 32 was molybdenum (Mo) having a thickness of 2,000 Å, the material layer 40 was a photoresist having a thickness of 1.6 µm, and the surface treatment film 42 was a fluorine group hydrophobic film. Also, a metal component of the conductive ink 52 was silver (Ag) and a solvent was N-Tetradecane. The UV ray source was a UV Ozone Cleaner.

Figure 13:
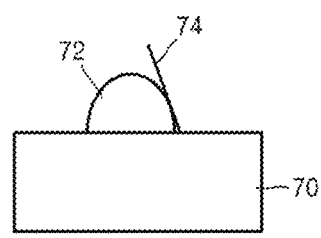
FIG. 13 is a cross-sectional view for explaining a contact angle of ink.

As depicted in FIG. 13, the contact angle of the conductive ink 72 denotes an angle between a surface of a substrate 70 where the conductive ink 72 is dropped and an imaginary contact surface 74 that contacts the conductive ink 72. If the surface of the substrate 70 is hydrophilic, the contact angle may be reduced. If the surface of the substrate 70 is hydrophobic, like the surface of the surface treatment film 42, the contact angle may become large.

Referring to first and second graphs G1 and G2 of FIG. 12, the reduction rates of the contact angle on the first wire 32 and the material layer 40 at the beginning of the irradiation are not significantly different from each other. However, it is seen that, beyond a certain time of UV ray irradiation, the reduction rate of the contact angle on the first wire 32 is greater than that of the contact angle on the material layer 40, and a contact angle difference is generated between the material layer 40 and the first wire 32. The contact angle difference between the first wire 32 and the material layer 40 is the largest when the UV ray irradiation time is 45 minutes, and afterwards, decreases. The largest contact angle difference denotes that the surface treatment film 42 on the first wire 32 is completely removed, and thus, the surface of the first wire 32 is completely hydrophilic, and the surface treatment film 42 on the surface of the material layer 40 still remains, and thus, the surface around the first wire 32 is completely hydrophobic. In this way, when characteristics of the two surfaces are completely different, the surface energy difference between the surface of the first wire 32 and the surface around the first wire 32 is the largest, and thus, the conductive ink 52 dropped around the first wire 32 gathers on the first wire 32 where the surface energy is relatively high. For this reason, as depicted in FIGS. 10 and 11, although a portion of the conductive ink 52 is dropped around the first wire 32, the conductive ink 52 eventually gathers on the first wire 32 in an inkjet printing process.

Referring to FIG. 12, when the UV ray irradiation time increases, the first and second graphs G1 and G2 converge to a point. This denotes that the contact angle of the conductive ink 52 on the first wire 32 and the material layer 40 are the same. The same contact angle denotes that both surfaces of the first wire 32 and the material layer 40 are hydrophilic.

In consideration of the result of FIG. 12, in FIG. 7, when the UV ray irradiation time with respect to the surface treatment film 42 is set as the time when the contact angle difference of the conductive ink 52 is the largest, after the irradiation is complete, the surface energy difference between the surface of the first wire 32 and the surface around the first wire 32 may be the largest. When an inkjet printing is performed in this state, the dropped conductive ink 52 around the first wire 32 gathers on the first wire 32, and accordingly, the second wire 50 may be correctly formed on the first wire 32. As a result, the thickness of identical wires may be increased to the same shape. Also, since an inkjet printing is performed when the material layer 40 is present around the first wire 32, the inkjet printing process may be easily performed. Accordingly, the thicknesses of complicated electrode wirings and thicknesses of wirings having a high integration rate may be readily increased.

Figure 14:
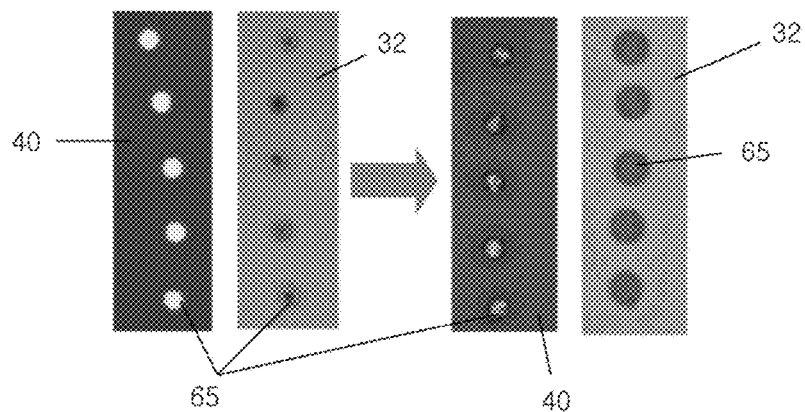
FIG. 14 is an image showing variations of ink size on the first wire and around thereof on a material layer in a method of forming a wire, according to some example embodiments.

FIG. 14 is an image showing variations of ink size used for obtaining the result of FIG. 12 before and after UV ray irradiation.

In FIG. 14, the left side shows sizes of ink 65 dropped on the material layer 40 and the first wire 32, which are coated with the surface treatment film 42, and the right side shows sizes of ink 65 dropped on the first wire 32 and the material layer 40 when the surface treatment film 42 remains on the material layer 40 and the surface of the first wire 32 is exposed as a result of the irradiation on the surface treatment film 42. In FIG. 14, for convenience, the surface treatment film 42 is not shown.

In the case of the left side, since the surface treatment film 42 is present on the surfaces of the first wire 32 and the material layer 40, the sizes of the ink 65 on the first wire 32 and the material layer 40 are the same. However, in the case of the right side, since the surface treatment film 42 is present only on the material layer 40, the sizes of the ink 65 on the material layer 40 are not different from those of the ink 65 on the left side. However, the sizes of the ink 65 on the first wire 32 in the right side are increased compared to the sizes of ink 65 in the left side. The increased area of the ink 65 denotes that the ink 65 spreads laterally and, thus, denotes a reduction of a contact angle of the ink 65. Accordingly, FIG. 14 shows that the surface treatment film 42 is removed from the surface of the first wire 32 as a result of the irradiation of the UV rays 46 and the surface of the first wire 32 is hydrophilic.

Figure 15:
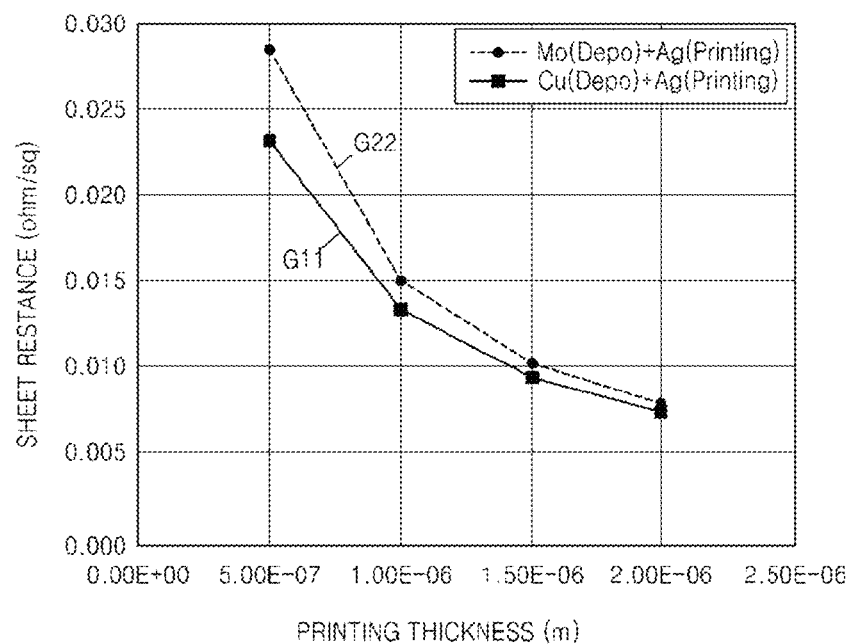
FIG. 15 is a graph showing a relationship between printing thickness increase of a second wiring and a sheet resistance of total wirings, according to some example embodiments.

FIG. 15 is a graph showing a relationship between printing thickness increase of the second wire 50 and a sheet resistance of total wires. In FIG. 15, the horizontal axis indicates printing thickness (meters) of the second wire 50, and the vertical axis indicates sheet resistance (ohms/square meter). In FIG. 15, a third graph G11 shoes a relationship when the first wire 32 is a copper (Cu) wiring and the second wire 50 is a silver (Ag) wiring, and a fourth graph G22 shows a relationship when the first wire 32 is a molybdenum (Mo) wiring and the second wire 50 is a silver (Ag) wiring.

Referring to third and fourth graphs G11 and G22, it is seen that the sheet resistance of the wirings is reduced as the thicknesses of wirings that include the first and second wires 32 and 50 increase. Considering that the thickness of a wiring varies according to the printing thickness of the second wire 50, the third and fourth graphs G11 and G22 show that, as the printing thickness of the second wire 50 increases, the sheet resistance of the wiring is reduced.

Figure 16:
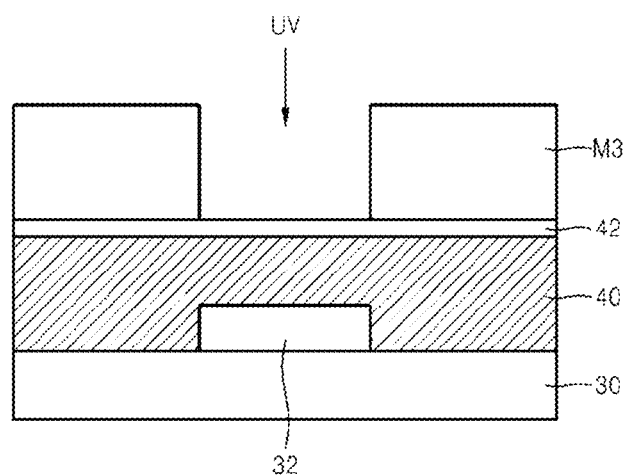
FIGS. 16 through 18 are cross-sectional views showing a method of forming an electrode wiring, according to some example embodiments.
Figure 17:
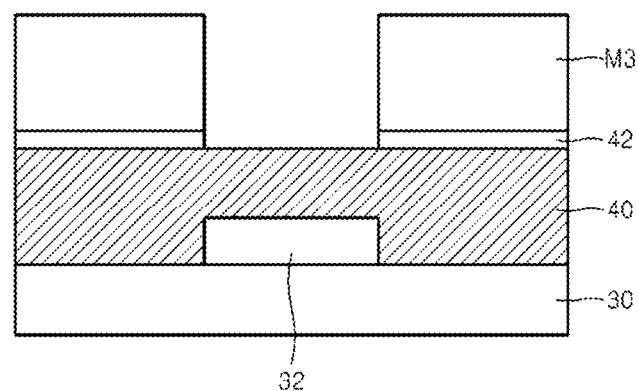
Figure 18:
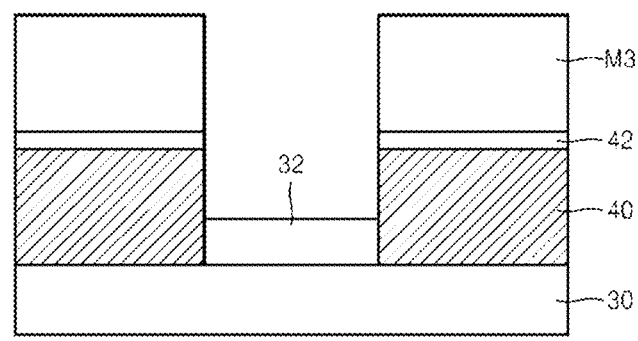

FIGS. 16 through 18 are cross-sectional views showing a method of forming an electrode wiring, according to some example embodiments. Referring to FIGS. 16 through 18, a material layer 40 and a surface treatment film 42 covering a first wire 32 may be sequentially formed on a substrate 30. The method of forming the surface treatment film 42 may be the same as the method described above. A mask M3 that defines a region corresponding to the first wire 32 may be formed on the surface treatment film 42. After forming the mask M3, a portion of the surface treatment film 42 corresponding to the first wire 32 may be removed by irradiating UV rays onto the surface treatment film 42 (refer to FIG. 17).

Next, if a portion of the material layer 40 corresponding to the first wire 32, for example, the first wire 32 is formed in advance, a portion of the material layer 40 on which the first wire 32 is formed, and if the first wire 32 is formed in a subsequent process, a portion of the material layer 40 where the first wire 32 is formed, is removed. In this way, as depicted in FIG. 18, a portion of the material layer 40 corresponding to the first wire 32 is removed.

Subsequent processes may vary according to the case in which the first wire 32 is formed before forming the material layer 40 (hereinafter, a first case) and the case in which the first wire 32 is formed after the material layer 40 is formed (hereinafter, a second case). In the first case, in FIG. 18, after removing the mask M3, as described with reference to FIG. 9, a second wire 50 may be formed on the first wire 32. In the second case, a portion of the material layer 40 on which the first wire 32 is formed is removed in a process of removing the material layer 40 and a portion of the substrate 30 on which the first wire 32 is formed is exposed.

Next, with the mask M3, a wiring layer (not shown) that covers the exposed portion of the substrate 30 is formed. The wiring layer is also formed on the mask M3. Afterwards, the wiring layer formed on the mask M3 is removed in a process of removing the mask M3. As a result, the wiring layer remains only on the exposed portion of the substrate 30 and becomes the first wire 32. Afterwards, the mask M3 is removed, and the second wire 50 may be formed on the first wire 32 according to the process described with reference to FIG. 9.

While example embodiments have been particularly shown and described, it will be understood by those of ordinary skill in the art that various changes in form and details may be made therein without departing from the spirit and scope of the present invention as defined by the following claims.

What is claimed is:

1. A method of forming a wiring, the method comprising:
   forming a first wire on a region of a substrate;
   forming a material layer having a thickness greater than that of the first wire on the substrate, except on the first wire;
   forming a surface treatment film on an upper surface of the material layer; and
   forming a second wire on the first wire;
   wherein the surface treatment film has physical properties opposite to that of a surface of the first wire,
   wherein the first wire is hydrophilic for the second wire, and
   wherein the surface treatment film is hydrophobic for the second wire.

2. The method of claim 1, wherein forming a first wire is performed before or after forming a material layer on the substrate.

3. The method of claim 1, wherein forming a surface treatment film comprises:
   coating a solution that includes a component of the surface treatment film on the first wire and the material layer;
   drying the coated solution; and
   removing the dried resultant product from the surface of the first wire.

4. The method of claim 3, wherein removing the dried resultant product from the surface of the first wire comprises irradiating UV rays on a remaining film, after drying the coated solution, until the first wire is exposed.

5. The method of claim 4, wherein the UV rays are deep UV rays or UV-ozone rays.

6. The method of claim 1, wherein forming a material layer and forming a surface treatment film on an upper surface of the material layer comprises:
sequentially forming the material layer and the surface treatment film on the substrate;
removing a portion of the surface treatment film corresponding to the first wire; and
removing a portion of the material layer corresponding to the first wire.

7. The method of claim 6, wherein removing a portion of the surface treatment film corresponding to the first wire comprises irradiating UV rays on the portion of the surface treatment film corresponding to the first wire.

8. The method of claim 6, wherein the first wire is formed before the material layer is formed.

9. The method of claim 6, wherein the first wire is formed after removing a portion of the material layer corresponding to the first wire.

10. The method of claim 6, further comprising:
removing contaminants from a surface where the surface treatment film is formed before forming the surface treatment film.

11. The method of claim 10, wherein removing contaminants comprises irradiating UV rays or plasma onto the surface where the surface treatment film is formed.

12. The method of claim 11, wherein the plasma is oxygen plasma or argon plasma.

13. The method of claim 1, wherein forming a second wire on the first wire comprises inkjet printing conductive ink that includes a component of the second wire on the first wire.

14. The method of claim 1, further comprising:
removing contaminants from a surface where the surface treatment film is formed before forming the surface treatment film.

15. The method of claim 1, wherein the material layer is an organic material layer or an inorganic material layer.

16. The method of claim 1, wherein the surface treatment film is a hydrophobic film, and
wherein the surface treatment film is an organic material film that comprises a self-assembled monolayer or a fluorine group polymer compound.

17. The method of claim 16, wherein the self-assembled monolayer is an organic silicon compound film.

18. The method of claim 17, wherein the organic silicon compound film includes $RSiX_3$, where R is an n-alkylsilane compound and X is a halogen or an alkoxy group.

19. The method of claim 1, wherein the first wire is at least one of a wiring that connects a semiconductor device and a power source, a wiring that connects a semiconductor device and another semiconductor device, a wiring that connects a semiconductor device and a connection wire, a wiring that connects a semiconductor device and a pixel, and a wiring that connects two separated contacts.

20. A method of forming a wiring, the method comprising:
forming a first wire on a substrate;
forming a material layer on the substrate and the first wire;
removing a portion of the material layer from the first wire;
forming a surface treatment film on the material layer and the first wire;
removing a portion, of the surface treatment film from the first wire; and
forming a second wire on the first wire;
wherein a thickness of the material layer on the substrate is greater than a thickness of the first wire on the substrate,
wherein the first wire is hydrophilic for the second wire, and
wherein the surface treatment film is hydrophobic for the second wire.

21. The method of claim 20, wherein forming a second wire on the first wire comprises inkjet printing conductive ink that includes a component of the second wire on the first wire.

22. The method of claim 20, wherein the material layer is an organic material layer.

23. The method of claim 20, wherein the material layer is an inorganic material layer.

24. The method of claim 20, wherein a surface of the first wire is hydrophilic.

25. The method of claim 20, wherein a surface of the substrate is hydrophilic.

26. The method of claim 20, wherein a surface of the substrate is hydrophobic.

27. The method of claim 20, wherein a surface of the surface treatment film is hydrophobic.

28. The method of claim 20, further comprising:
removing contaminants from a surface of the material layer before forming the surface treatment film on the material layer.

29. The method of claim 20, further comprising:
removing contaminants from a surface of the first wire before forming the surface treatment film on the first wire.

* * * * *